United States Patent
Kim (10) Patent No.: US 9,494,958 B2
(45) Date of Patent: Nov. 15, 2016

(54) SEMICONDUCTOR APPARATUS

(71) Applicant: SK hynix Inc., Icheon-si Gyeonggi-do (KR)

(72) Inventor: Jong Sam Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 94 days.

(21) Appl. No.: 14/242,994

(22) Filed: Apr. 2, 2014

(65) Prior Publication Data
US 2015/0185745 A1    Jul. 2, 2015

(30) Foreign Application Priority Data
Dec. 30, 2013  (KR) .................. 10-2013-0167052

(51) Int. Cl.
*G05F 1/10*  (2006.01)
*G05F 1/46*  (2006.01)
*G01R 19/00*  (2006.01)
*G05F 1/613*  (2006.01)

(52) U.S. Cl.
CPC ........... *G05F 1/465* (2013.01); *G01R 19/0084* (2013.01); *G05F 1/613* (2013.01)

(58) Field of Classification Search
CPC ...................... H01L 2924/0002; H02M 3/073; G11C 5/145; G11C 5/147
See application file for complete search history.

(56) References Cited

U.S. PATENT DOCUMENTS

| | | | | |
|---|---|---|---|---|
| 5,862,096 A | * | 1/1999 | Yasuda | G11O 5/147 365/189.09 |
| 2009/0184751 A1 | * | 7/2009 | Park | H02M 3/07 327/535 |
| 2009/0273738 A1 | * | 11/2009 | Fukumoto | H05B 41/2827 349/70 |
| 2014/0146238 A1 | * | 5/2014 | Murakami | H04N 5/63 348/730 |

FOREIGN PATENT DOCUMENTS

KR    1020000045321 A    7/2000

* cited by examiner

*Primary Examiner* — Sibin Chen
(74) *Attorney, Agent, or Firm* — William Park & Associates Ltd.

(57) ABSTRACT

A voltage generation circuit of a semiconductor apparatus includes a first detection block configured to detect an output voltage and output a first detection signal; a second detection block configured to detect the output voltage and output a second detection signal; a signal generation block configured to generate a control signal in response to the first detection signal and the second detection signal; and a voltage generation block configured to generate the output voltage in response to the control signal, wherein responding speeds of the first detection block and the second detection block with respect to a variation in the output voltage are different.

20 Claims, 6 Drawing Sheets

SEMICONDUCTOR APPARATUS

CROSS-REFERENCES TO RELATED APPLICATION

The present application claims priority under 35 U.S.C. §119(a) to Korean application number 10-2013-0167052, filed on Dec. 30, 2013, in the Korean Intellectual Property Office, which is incorporated herein by reference in its entirety.

TECHNICAL FIELD

Various embodiments relate to a semiconductor apparatus, and more particularly, to a circuit for stably generating an internal voltage of a semiconductor apparatus.

BACKGROUND

A semiconductor apparatus may generate internal voltages according to various voltage levels required inside the semiconductor apparatus, from external power supplied from an exterior. The generated internal voltages may be respectively supplied to corresponding internal circuits. Kinds of internal voltages may include a core voltage (Vcore), a bulk bias voltage (Vbb), a pumping voltage (Vpp), and so forth. An internal voltage generation circuit may be disposed to generate each of the internal voltages.

SUMMARY

In an embodiment, a voltage generation circuit of a semiconductor apparatus may include: a first detection block configured to detect an output voltage and output a first detection signal. In addition, second detection block may be configured to detect the output voltage and output a second detection signal. A signal generation block may be configured to generate a control signal in response to the first detection signal and the second detection signal. Further, a voltage generation block may be configured to generate the output voltage in response to the control signal, wherein responding speeds of the first detection block and the second detection block with respect to a variation in the level of the output voltage are different.

In an embodiment a voltage generation circuit of a semiconductor apparatus may include: a first detection block configured to detect an output voltage and output a first detection signal according to a first detection result. A second detection block may be configured to detect the output voltage and output a second detection signal according to a second detection result. A voltage generation block may be configured to an on or an off position based on the first detection signal and the second detection signal. The voltage generation block may generate the output voltage when being turned on. The first detection signal is disabled earlier than the second detection signal when the output voltage falls, and the second detection signal is enabled earlier than the first detection signal when the output voltage rises.

DETAILED DESCRIPTION

Hereinafter, a semiconductor apparatus will be described below with reference to the accompanying drawings through various embodiments. The internal voltage generation circuit may be required to stably generate an internal voltage. To this end, the internal voltage generation circuit may be turned on by a control signal when the level of the internal voltage falls below a target level, to raise the level of the internal voltage. The internal voltage generation circuit may be turned off by a control signal when the level of the internal voltage rises over a target level, to lower the level of the internal voltage. That is to say, the internal voltage generation circuit should be turned on and off immediately according to a variation in the level of the internal voltage, to stably generate the internal voltage. When such a condition is fulfilled, the semiconductor apparatus may smoothly perform an operation, and unnecessary current consumption may be reduced.

Figure 1:
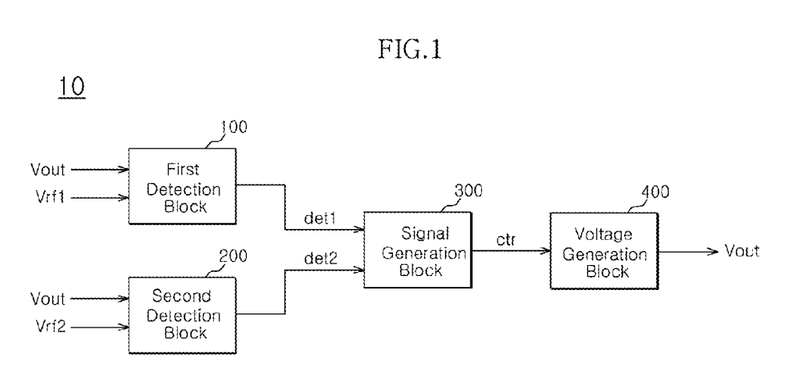
FIG. 1 is a block diagram exemplarily showing a voltage generation circuit of a semiconductor apparatus in accordance with an embodiment.

FIG. 1 is a block diagram exemplarily showing a voltage generation circuit 10 of a semiconductor apparatus in accordance with an embodiment. Referring to FIG. 1, there is shown a voltage generation block 400 which is configured to generate an output voltage Vout based on detection results of a first detection block 100 and a second detection block 200 configured to detect the level of the output voltage Vout.

The voltage generation circuit 10 may include the first detection block 100, the second detection block 200, a signal generation block 300, and the voltage generation block 400.

The first detection block 100 may be configured to detect the level of the output voltage Vout and output a first detection signal det1 according to a detection result. For example, the first detection block 100 may compare a first reference voltage Vrf1 and the output voltage Vout and output the first detection signal den according to a comparison result.

The second detection block 200 may be configured to detect the level of the output voltage Vout and output a second detection signal det2 according to a detection result. For example, the second detection block 200 may compare a second reference voltage Vrf2 and the output voltage Vout and output the second detection signal det2 according to a comparison result.

The signal generation block 300 may be configured to output a control signal ctr in response to the first detection signal den and the second detection signal det2. For example, the signal generation block 300 may generate the control signal ctr in response to one signal which transitions more quickly, between the first detection signal den and the second detection signal det2 having the same logic level.

The voltage generation block 400 may be configured to generate the output voltage Vout in response to the control signal ctr. The output voltage Vout generated by the voltage generation block 400 may be any one of internal voltages of a semiconductor apparatus, for example, such as a core voltage, a bulk bias voltage and a pumping voltage. For example, the voltage generation block 400 may be a general voltage pumping circuit of a semiconductor apparatus. The voltage generation block 400 may generate the output voltage Vout by setting a predetermined target voltage. In detail, the voltage generation block 400 may be turned on and pump the output voltage Vout, in response to the control signal ctr which is enabled when the level of the output voltage Vout is lower by a preset level than the level of the target voltage. Further, the voltage generation block 400 may be turned off and not pump the output voltage Vout, in response to the control signal ctr which is disabled when the level of the output voltage Vout is higher by a preset level than the level of the target voltage.

The control signal ctr for on/off controlling the voltage generation block 400 or for placing the voltage generation block 400 in an on or off position may be generated based on the first and second detection signals det1 and det2; that is, detection results of the first and second detection blocks 100 and 200. In other words, the voltage generation block 400 may be on/off controlled substantially based on the first and second detection signals det1 and det2. The signal generation block 300, which generates the control signal ctr based on the first and second detection signals det1 and det2, is described as a separate component element to best describe an embodiment. It is to be noted that the signal generation block 300 may be configured, for example, in the voltage generation block 400. In this case, the voltage generation block 400 may be on/off controlled based on the first and second detection signals det1 and det2.

Figure 6:
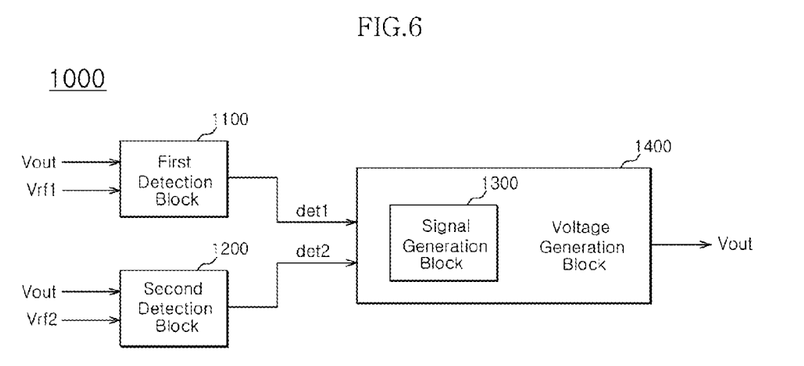
FIG. 6 is a block diagram exemplarily showing a voltage generation circuit of a semiconductor apparatus in accordance with an embodiment.

FIG. 6 is a block diagram exemplarily showing a voltage generation circuit 1000 of a semiconductor apparatus in accordance with an embodiment. Referring to FIG. 6, the voltage generation circuit 1000 may include the first detection block 1100, the second detection block 1200, and the voltage generation block 1400. The voltage generation block 1400 may include the signal generation block 1300. The configuration and operating method of the voltage generation circuit 1000 may be similar to the voltage generation circuit 10 of FIG. 1. Therefore, detailed descriptions thereof will be omitted herein.

Referring again to FIG. 1, the first and second detection signals det1 and det2 are related with a speed responding to a variation in the level of the output voltage Vout.

The first detection block 100 and the second detection block 200 according to an embodiment may have different responding speeds with respect to a variation in the level of the output voltage Vout. For example, the responding speed of the first detection block 100 with respect to a fall in the level of the output voltage Vout may be faster than the responding speed of the second detection block 200. In this case, the voltage generation block 400 may be turned on substantially by the detection result of the first detection block 100 as the first detection signal det1 may be disabled. Accordingly, the first detection block 100 may be expressed as being excellent in an "on characteristic." Conversely, the responding speed of the second detection block 200 with respect to a rise in the level of the output voltage Vout may be faster than the responding speed of the first detection block 100. In this case, the voltage generation block 400 may be turned off substantially by the detection result of the second detection block 200 as the second detection signal det2 may be enabled. Therefore, the second detection block 200 may be expressed as being excellent in an "off characteristic."

In an embodiment, since the voltage generation circuit 10 includes the detection blocks 100 and 200 which have different responding speeds with respect to a variation in the level of the output voltage Vout, it is possible to effectively control the turn-on and turn-off of the voltage generation block 400 when compared to the case where only one detection block is provided. To achieve such a goal, a detailed configuration, an operating method and working effects resulting therefrom will be described below in detail.

Figure 2:
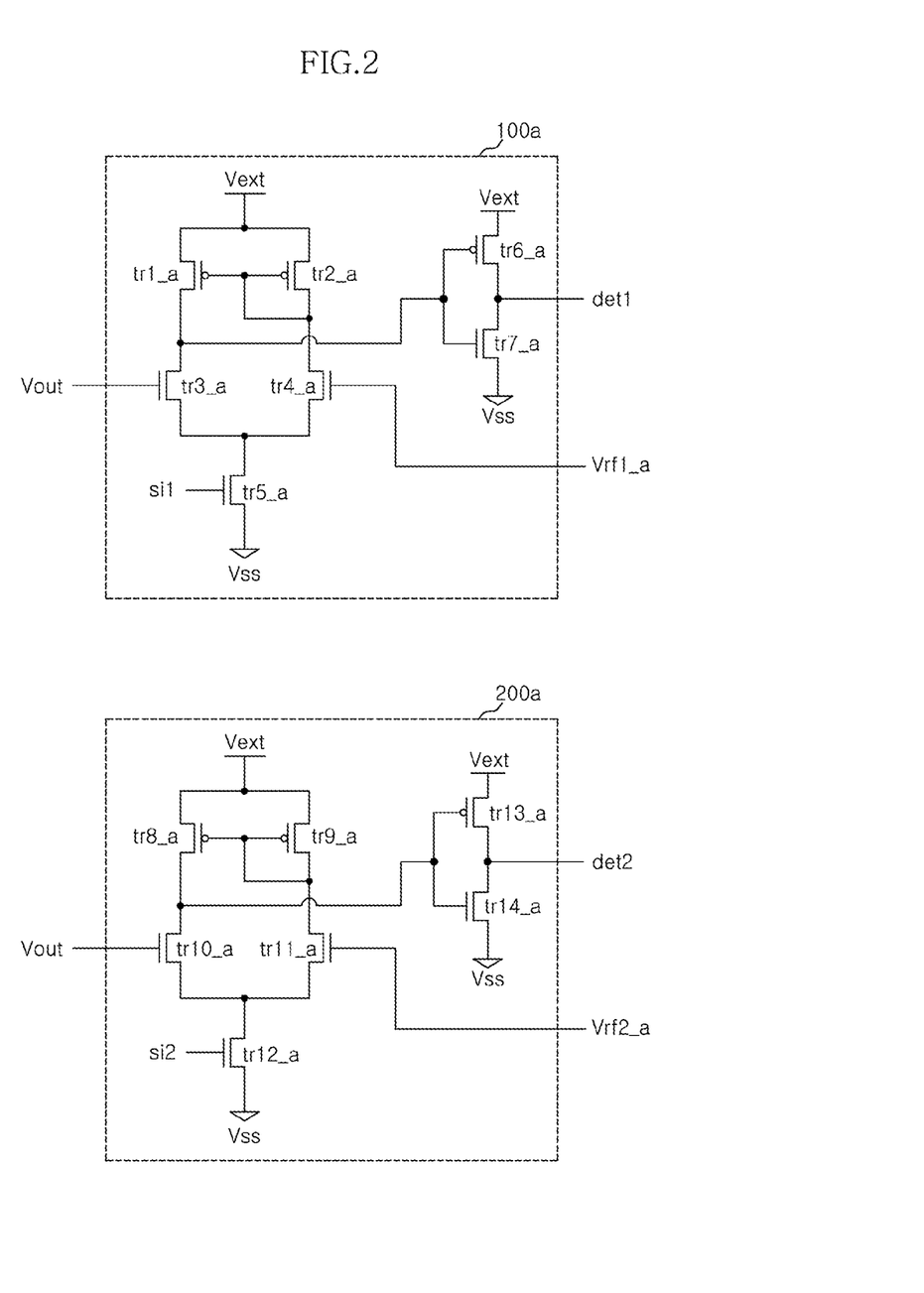
FIG. 2 is a circuit diagram showing in detail embodiments of the first detection block and the second detection block shown in FIG. 1.

FIG. 2 is a circuit diagram showing in detail embodiments of the first detection block 100 and the second detection block 200 shown in FIG. 1.

Before making descriptions, it is to be noted that a first detection block 100a and a second detection block 200a of FIG. 2 will be distinguished from other embodiments (shown in FIG. 5) of the first detection block 100 and the second detection block 200 of FIG. 1, by the suffix "a" added in their reference numerals. In other embodiments shown in FIG. 5, the suffix "b" will be used. Therefore, a first reference voltage Vrf1_a and a second reference voltage Vrf2_a in FIG. 2 may respectively be embodiments of the first reference voltage Vrf1 and the second reference voltage Vrf2 of FIG. 1.

The first detection block 100a may be configured to detect the level of the output voltage Vout and output the first detection signal det1 according to a detection result. The first detection block 100a may be applied with a first sink signal si1 with a logic high level, compare the first reference voltage Vrf1_a and the output voltage Vout, and output the first detection signal det1 according to a comparison result. For example, the first detection block 100a may output the first detection signal det1 which is disabled, when the level of the output voltage Vout is lower than the level of the first reference voltage Vrf1_a. For example, the first detection block 100a may output the first detection signal det1 which is enabled, when the level of the output voltage Vout is higher than the level of the first reference voltage Vrf1_a. The first reference voltage Vrf1_a may be set in consideration of the target voltage of the voltage generation block 400.

The first detection block 100a may include first to seventh transistors tr1_a to tr7_a. The source of the first transistor tr1_a may be applied with an external voltage Vext. The source of the second transistor tr2_a may be applied with the external voltage Vext, and the gate and the drain of the second transistor tr2_a may be electrically coupled with the gate of the first transistor tr1_a. The drain of the third transistor tr3_a may be electrically coupled with the drain of the first transistor tr1_a, and the gate of the third transistor tr3_a may be applied with the output voltage Vout. The drain of the fourth transistor tr4_a may be electrically coupled with the drain of the second transistor tr2_a, and the gate of the fourth transistor tr4_a may be applied with the first reference voltage Vrf1_a. The drain of the fifth transistor tr5_a may be electrically coupled with the sources of the third and fourth transistors tr3_a and tr4_a; the source of the fifth transistor tr5_a may be grounded; and the gate of the fifth transistor tr5_a may be applied with the first sink signal sit. The source of the sixth transistor tr6_a may be applied with the external voltage Vext; and the gate of the sixth transistor tr6_a may be electrically coupled with a node to which the drains of the first and third transistors tr1_a and tr3_a are electrically coupled. The drain of the seventh transistor tr7_a may be electrically coupled with the drain of the sixth transistor tr6_a; the gate of the seventh transistor tr7_a may be electrically coupled with the gate of the sixth transistor tr6_a; and the source of the seventh transistor tr7_a may be grounded. In this case, the first detection signal den may be outputted from a node to which the drains of the sixth and seventh transistors tr6_a and tr7_a are electrically coupled.

The second detection block 200a may be configured to detect the level of the output voltage Vout and output the second detection signal det2 according to a detection result. The second detection block 200a may be applied with a second sink signal sit with a logic high level; compare the second reference voltage Vrf2_a and the output voltage Vout; and output the second detection signal det2 according to a comparison result. For example, the second detection block 200a may output the second detection signal det2 which is disabled, when the level of the output voltage Vout is lower than the level of the second reference voltage Vrf2_a. For example, the second detection block 200a may output the second detection signal det2 which is enabled, when the level of the output voltage Vout is higher than the level of the second reference voltage Vrf2_a. The second reference voltage Vrf2_a may be set in consideration of the target voltage of the voltage generation block 400.

The second detection block 200a may include eighth to fourteenth transistors tr8_a to tr14_a. The source of the eighth transistor tr8_a may be applied with the external voltage Vext. The source of the ninth transistor tr9_a may be applied with the external voltage Vext, and the gate and the drain of the ninth transistor tr9_a may be electrically coupled with the gate of the eighth transistor tr8_a. The drain of the tenth transistor tr10_a may be electrically coupled with the drain of the eighth transistor tr8_a, and the gate of the tenth transistor tr10_a may be applied with the output voltage Vout. The drain of the eleventh transistor tr11_a may be electrically coupled with the drain of the ninth transistor tr9_a, and the gate of the eleventh transistor tr11_a may be applied with the second reference voltage Vrf2_a. The drain of the twelfth transistor tr12_a may be electrically coupled with the sources of the tenth and eleventh transistors tr10_a and tr11_a; the source of the twelfth transistor tr12_a may be grounded; and the gate of the twelfth transistor tr12_a may be applied with the second sink signal sit. The source of the thirteenth transistor tr13_a may be applied with the external voltage Vext; and the gate of the thirteenth transistor tr13_a may be electrically coupled with a node to which the drains of the eighth and tenth transistors tr8_a and tr10_a are electrically coupled. The drain of the fourteenth transistor tr14_a may be electrically coupled with the drain of the thirteenth transistor tr13_a, the gate of the fourteenth transistor tr14_a may be electrically coupled with the gate of the thirteenth transistor tr13_a; and the source of the fourteenth transistor tr14_a may be grounded. In this case, the second detection signal det2 may be outputted from a node to which the drains of the thirteenth and fourteenth transistors tr13_a and tr14_a are electrically coupled. FIG. 2 also illustrates a ground voltage Vss.

As described above, the first detection block 100a and the second detection block 200a may have different responding speeds with respect to a variation in the level of the output voltage Vout. For example, the responding speed of the first detection block 100a with respect to a fall in the level of the output voltage Vout may be faster than the responding speed of the second detection block 200a. In this case, when the level of the output voltage Vout falls, the first detection signal det1 may be disabled earlier than the second detection signal det2. Conversely, the responding speed of the second detection block 200a with respect to a rise in the level of the output voltage Vout may be faster than the responding speed of the first detection block 100a. In this case, when the level of the output voltage Vout rises, the second detection signal det2 may be enabled earlier than the first detection signal det1.

When the aforementioned assumption with regard to the responding speed characteristics is continuously retained, for example, the first reference voltage Vrf1_a may be applied to have a level higher than the level of the second reference voltage Vrf2_a. For another example, in order to ensure that the first and second detection blocks 100a and 200a have the above-described responding speed characteristics, at least one of the gate threshold voltage, the channel width, the channel length and the doping amount of each of the first to fourteenth transistors tr1_a to tr14_a may be controlled.

Figure 3:
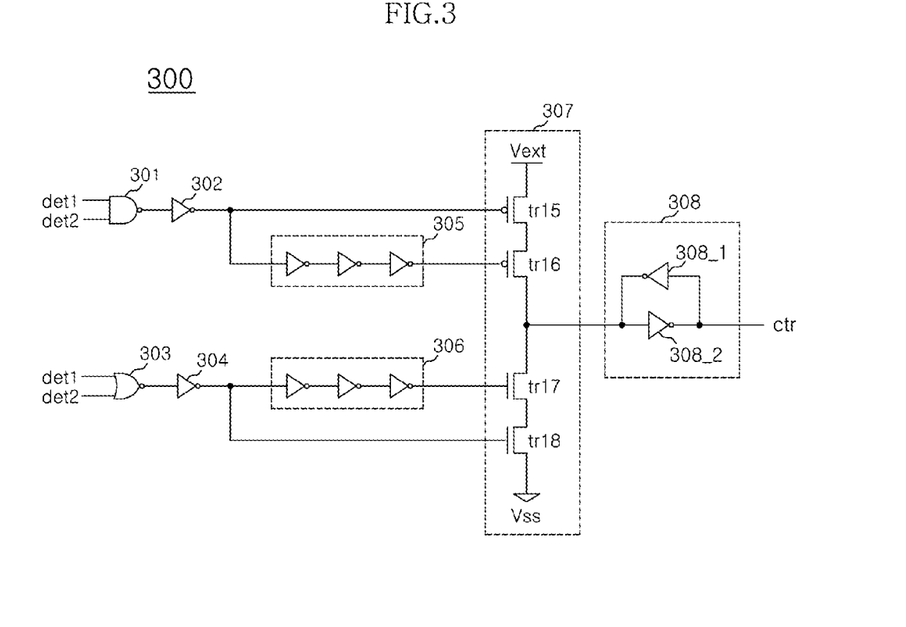
FIG. 3 is a circuit diagram showing in detail the signal generation block shown in FIG. 1.

FIG. 3 is a circuit diagram showing in detail the signal generation block 300 shown in FIG. 1.

The signal generation block 300 may be configured to output the control signal ctr in response to the first detection signal det1 and the second detection signal det2. The signal generation block 300 may generate the control signal ctr in response to one signal which transitions more quickly, between the first detection signal det1 and the second detection signal det2 having the same logic level. Namely, the signal generation block 300 may generate the control signal ctr based on the first detection signal det1 or the second detection signal det2 which is outputted as a variation in the level of the output voltage Vout is earlier reflected thereon.

In detail, the signal generation block 300 may generate the control signal ctr which is enabled in response to any one of the first and second detection signals det1 and det2 which earlier transitions to a disabled state while both the first and second detection signals det1 and det2 are in an enabled state. Further, the signal generation block 300 may generate the control signal ctr which is disabled in response to any one of the first and second detection signals det1 and det2 which earlier transitions to an enabled state while both the first and second detection signals det1 and det2 are in a disabled state.

The signal generation block 300 may include a NAND gate 301, a first inverter 302, a NOR gate 303, a second inverter 304, first and second delay lines 305 and 306, a driver 307, and a latch unit 308.

The NAND gate 301 may receive the first detection signal det1 and the second detection signal det2 and perform a NAND operation. The first inverter 302 may receive and invert the output of the NAND gate 301 and output a resultant signal. The first delay line 305 may receive and delay the output of the first inverter 302. The first delay line 305 may invert the output of the first inverter 302 and output a resultant signal. The NOR gate 303 may receive the first detection signal det1 and the second detection signal det2 and perform a NOR operation. The second inverter 304 may receive and invert the output of the NOR gate 303 and output a resultant signal. The second delay line 306 may receive and delay the output of the second inverter 304. The second delay line 306 may invert the output of the second inverter 304 and output a resultant signal. It is to be noted that the numbers of the inverters of the first and second delay lines 305 and 306 shown in the drawing are for an illustration purpose only.

The driver 307 may receive the outputs of the first inverter 302, the first delay line 305, the second inverter 304 and the second delay line 306. The driver 307 may output a signal which is enabled to the level of the external voltage Vext, when at least one of the outputs of the second inverter 304 and the second delay line 306 is outputted to a logic low level; and both the outputs of the first inverter 302 and the first delay line 305 are outputted to logic low levels. The driver 307 may output a signal which is disabled to the level of a ground voltage, when at least one of the outputs of the first inverter 302 and the first delay line 305 is outputted to a logic high level; and both the outputs of the second inverter 304 and the second delay line 306 are outputted to logic high levels.

The driver 307 may include fifteenth to eighteenth transistors tr15 to tr18.

The source of the fifteenth transistor tr15 may be applied with the external voltage Vext, and the gate of the fifteenth transistor tr15 may be applied with the output of the first inverter 302. The source of the sixteenth transistor tr16 may be electrically coupled with the drain of the fifteenth transistor tr15, and the gate of the sixteenth transistor tr16 may be applied with the output of the first delay line 305. The drain of the seventeenth transistor tr17 may be electrically coupled with the drain of the sixteenth transistor tr16, and the gate of the seventeenth transistor tr17 may be applied with the output of the second delay line 306. The drain of the eighteenth transistor tr18 may be electrically coupled with the source of the seventeenth transistor tr17; the source of the eighteenth transistor tr18 may be grounded; and the gate of the eighteenth transistor tr18 may be applied with the output of the second inverter 304. In this case, the driver 307 may output a signal to the latch unit 308 from a node to which the drains of the sixteenth and seventeenth transistors tr16 and tr17 are electrically coupled.

The latch unit 308 may receive and latch the output of the driver 307 and output the control signal ctr. The latch unit 308 may include inverters 308_1 and 308_2 to latch the output of the driver 307.

Figure 4:
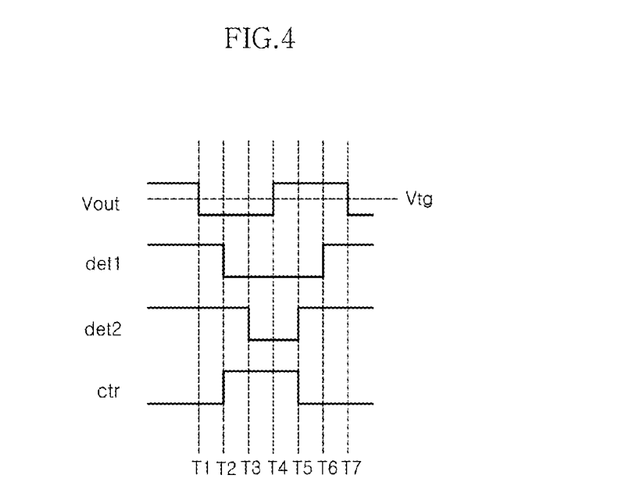
FIG. 4 is a timing diagram explaining operations of the voltage generation circuit shown in FIG. 1.

FIG. 4 is a timing diagram explaining operations of the voltage generation circuit 10 shown in FIG. 1. Referring to FIG. 4, the output voltage Vout is retained in such a way as to oscillate from the level of a target voltage Vtg due to repetitive turn-on and turn-off of the voltage generation block 400; and to this end, times at which the first and second detection signals det1 and det2 and the control signal ctr transition are shown.

Hereinafter, an operating method of the voltage generation circuit 10 will be described in detail with reference to FIGS. 1 to 4.

First, the first and second detection blocks 100 and 200 may output the first and second detection signals det1 and det2 which are enabled. The signal generation block 300 may receive the first and second detection signals det1 and det2 which are enabled, and output the control signal ctr which is disabled. The voltage generation block 400 may be turned off in response to the control signal ctr which is disabled.

At a time T1, the level of the output voltage Vout may become lower than the level of the target voltage Vtg. At this time, the level of the output voltage Vout may fall to be lower than the levels of the first and second reference voltages Vrf1 and Vrf2, so as to be detected by the first and second detection blocks 100 and 200.

At a time T2, because the responding speed of the first detection block 100 with respect to a fall in the level of the output voltage Vout is faster than the responding speed of the second detection block 200, the first detection block 100 may earlier output the first detection signal det1 which is disabled. The signal generation block 300 may output the control signal ctr which is enabled, in response to the disabled first detection signal det1 and the enabled second detection signal det2.

At a time T3, the second detection block 200 may subsequently output the second detection signal det2 which is disabled.

At a time T4, the voltage generation block 400 may be turned on in response to the control signal ctr which is enabled. Accordingly, the level of the output voltage Vout may rise, and may become higher than the level of the target voltage Vtg. At this time, the level of the output voltage Vout may rise to be higher than the levels of the first and second reference voltages Vrf1 and Vrf2, so as to be detected by the first and second detection blocks 100 and 200.

At a time T5, because the responding speed of the second detection block 200 with respect to a rise in the level of the output voltage Vout is faster than the responding speed of the first detection block 100, the second detection block 200 may earlier output the second detection signal det2 which is enabled. The signal generation block 300 may output the control signal ctr which is disabled, in response to the enabled second detection signal det2 and the disabled first detection signal det1.

At a time T6, the first detection block 100 may subsequently output the first detection signal det1 which is enabled.

At a time T7, the voltage generation block 400 may be turned off in response to the control signal ctr which is disabled. Accordingly, the level of the output voltage Vout may fall.

As can be readily seen from the above descriptions, the voltage generation block 400 may be quickly and repeatedly turned on and off according to variations in the level of the output voltage Vout, and may generate the output voltage Vout which is retained in such a way as to oscillate from the target voltage Vtg.

In the case where a power generation circuit includes only one detection block, a limitation may exist in designing the one detection block to be excellent in both an on characteristic and an off characteristic. Since the power generation circuit 10 includes detection blocks which have different responding speeds with respect to a variation in the level of the output voltage Vout, it is possible to quickly control the turn-on and turn-off of the voltage generation block 400 when compared to the case where only one detection block is provided. For example, in the case where the first detection block 100 is configured to be excellent in an on characteristic and the second detection block 200 is configured to be excellent in an off characteristic as assumed above; detection blocks which take whole charge of the turn-on and turn-off of the voltage generation block 400 separately exist; and the turn-on timing and turn-off timing of the voltage generation block 400 may be respectively set without being influenced by each other. When the turn-on timing and turn-off timing of the voltage generation block 400 are appropriately set, the output voltage Vout may be stably generated.

Figure 5:
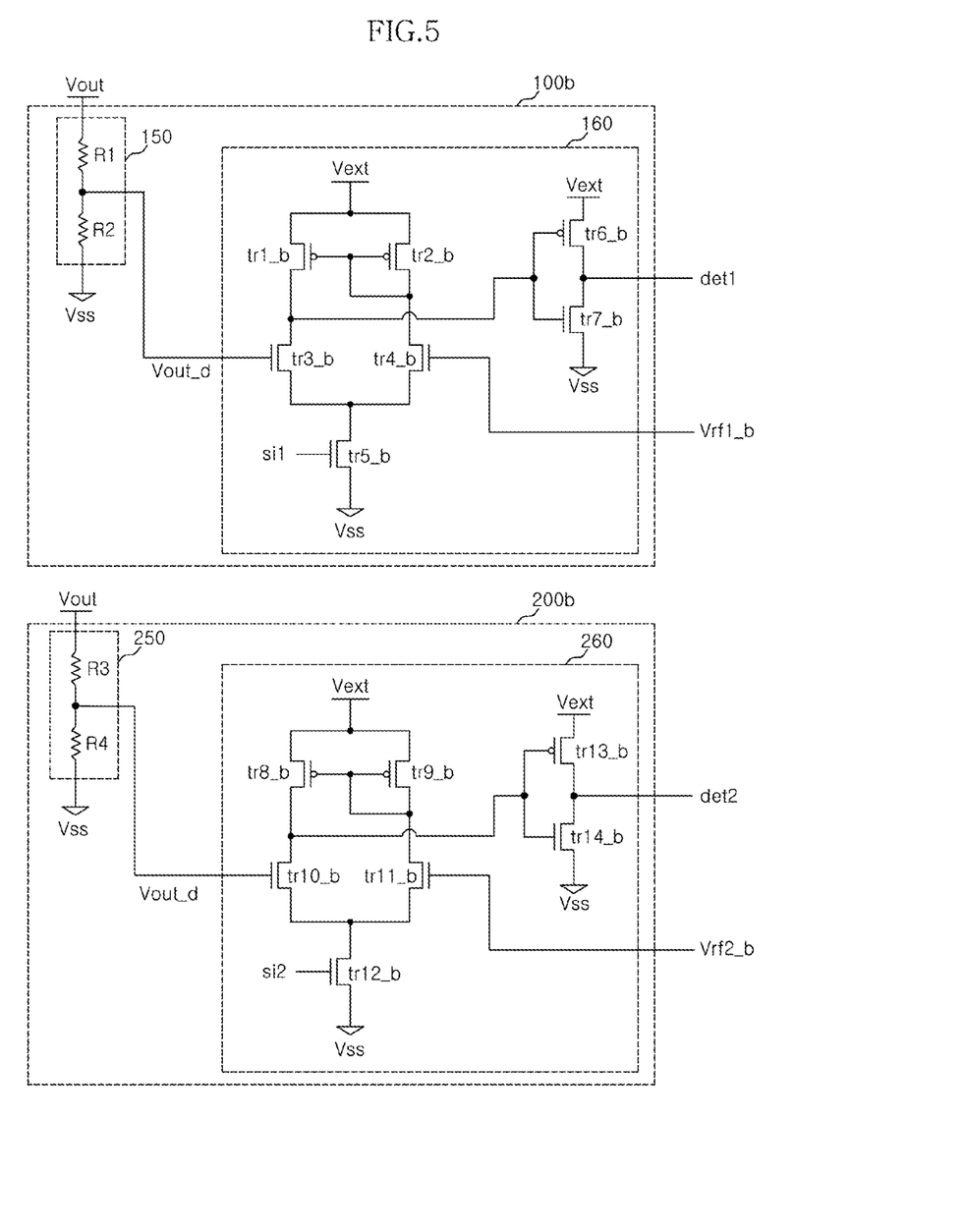
FIG. 5 is a circuit diagram showing in detail other embodiments of the first detection block and the second detection block shown in FIG. 1.

FIG. 5 is a circuit diagram showing in detail other embodiments of the first detection block 100 and the second detection block 200 shown in FIG. 1.

It is to be noted that a first detection block 100b and a second detection block 200b of FIG. 5 will be distinguished from the above-described embodiments (shown in FIG. 2) of the first detection block 100 and the second detection block 200 of FIG. 1, by the suffix "b" added in their reference numerals. Therefore, a first reference voltage Vrf1_b and a second reference voltage Vrf2_b in FIG. 5 may respectively be embodiments of the first reference voltage Vrf1 and the second reference voltage Vrf2 of FIG. 1.

The first detection block 100b of FIG. 5 may include a first voltage division block 150 and a first comparison block 160 which has a configuration similar to the first detection block 100a of FIG. 2. The first detection block 100a may include transistors tr1_b to tr7_b.

The first voltage division block 150 may include resistors R1 and R2 for dividing the output voltage Vout. The first voltage division block 150 may be configured to output the output voltage Vout which is divided by the resistors R1 and R2, as a divided output voltage Vout_d.

The first comparison block 160 may be configured to compare the first reference voltage Vrf1_b and the divided output voltage Vout_d and output the first detection signal det1 according to a comparison result. The first reference voltage Vrf1_b applied to the first detection block 100b of FIG. 5 may be a voltage with a level lower than the first reference voltage Vrf1_a applied to the first detection block 100a of FIG. 2. That is to say, the level of the first reference voltage Vrf1_b may be set in correspondence to a division ratio of the first voltage division block 150.

The second detection block 200b of FIG. 5 may include a second voltage division block 250 and a second comparison block 260 which has a configuration similar to the second detection block 200a of FIG. 2.

The second voltage division block 250 may include resistors R3 and R4 for dividing the output voltage Vout. The second voltage division block 250 may be configured to output the output voltage Vout which is divided by the resistors R3 and R4, as the divided output voltage Vout_d. The second detection block 200b may also include transistors tr8_b to tr14_b.

The second comparison block 260 may be configured to compare the second reference voltage Vrf2_b and the divided output voltage Vout_d and output the second detection signal det2 according to a comparison result. The second reference voltage Vrf2_b applied to the second detection block 200b of FIG. 5 may be a voltage with a level lower than the second reference voltage Vrf2_a applied to the second detection block 200a of FIG. 2. That is to say, the level of the second reference voltage Vrf2_b may be set in correspondence to a division ratio of the second voltage division block 250.

Except these descriptions, the configuration and operating method of the first and second detection blocks 100b and 200b of FIG. 5 may be similar to the configuration and operating method of the first and second detection blocks 100a and 200a of FIG. 2. Thus, detailed descriptions thereof will be omitted herein.

Figure 7:
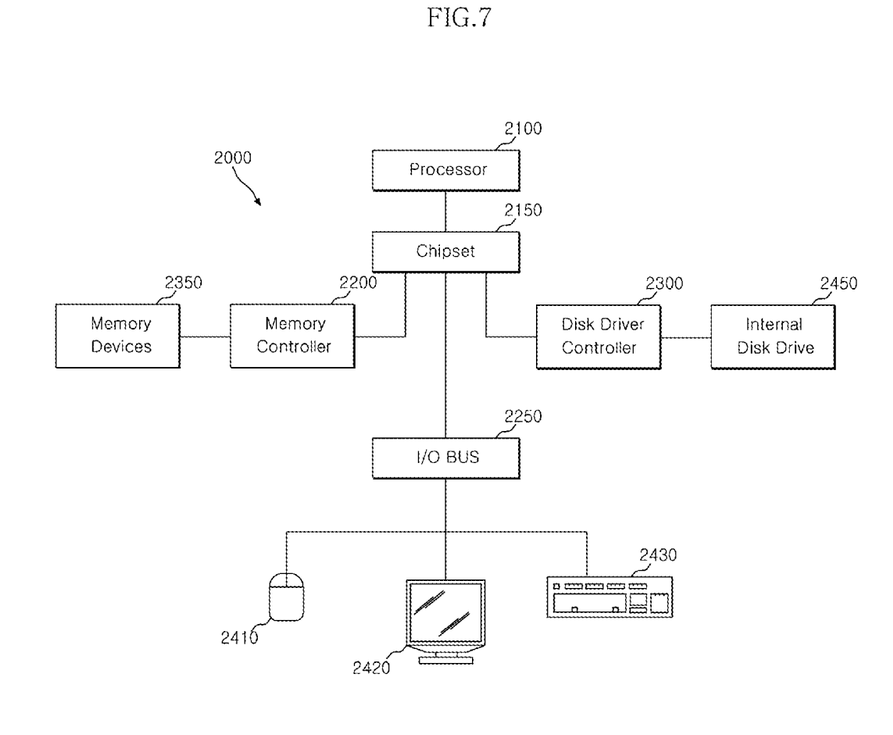
FIG. 7 illustrates a block diagram of a system employing a memory controller circuit in accordance with an embodiment.

Referring to FIG. 7, a system may include one or more processors 2100. The processor 2100 may be used individually or in combination with other processors. A chipset 2150 may be electrically coupled to the processor 2100. The chipset 2150 is a communication pathway for signals between the processor 2100 and other components of the system 2000. Other components may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be electrically coupled to the chipset 2150. The memory controller 2200 can receive a request provided from the processor 2100, through the chipset 2150. The memory controller may be electrically coupled to one or more memory devices 2350. The memory device 2350 may include the semiconductor apparatus described above.

The chipset 2150 may also be electrically coupled to the I/O bus 2250. The I/O bus 2250 may serve as a communication pathway for signals from the chipset 2150 to I/O devices 2410, 2420 and 2430. The I/O devices 2410, 2420 and 2430 may include a mouse 2410, a video display 2420, or a keyboard 2430. The I/O bus may employ any one of a number of communications protocols to communicate with the I/O devices 2410, 2420 and 2430.

The disk drive controller 2300 may also be electrically coupled to the chipset 2150. The disk drive controller 2300 may serve as a communication pathway between the chipset 2150 and one or more internal disk drives 2450. The disk drive controller 2300 and the internal disk drive 2450 may communicate with each other or with the chipset 2150 using virtually any type of communication protocol.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A voltage generation circuit of a semiconductor apparatus, comprising:
    a first detection block configured to detect an output voltage and output a first detection signal;
    a second detection block configured to detect the output voltage and output a second detection signal;
    a signal generation block configured to generate a control signal in response to the first detection signal and the second detection signal; and
    a voltage generation block configured to generate the output voltage in response to the control signal,
    wherein responding speeds of the first detection block and the second detection block with respect to a variation in the output voltage are different,
    wherein when there is a voltage change, both the first detection block and the second detection block will activate or both will de-activate, but one of the first and second detection blocks will activate or de-activate faster than the other, and
    wherein the signal generation block generates the control signal which is enabled in response to the first detection signal and generates the control signal which is disabled in response to the second detection signal.

2. The voltage generation circuit according to claim 1, wherein the responding speed of the first detection block with respect to a fall in the output voltage is faster than the responding speed of the second detection block.

3. The voltage generation circuit according to claim 2, wherein the first detection block comprises:
    a first transistor, and wherein, in order to ensure that the responding speed of the first detection block with respect to the fall in the output voltage is faster than the responding speed of the second detection block, at least one of a gate threshold voltage, a channel width, a channel length and a doping amount of the first transistor is controlled.

4. The voltage generation circuit according to claim 1, wherein the responding speed of the second detection block with respect to a rise in the output voltage is faster than the responding speed of the first detection block.

5. The voltage generation circuit according to claim 4, wherein the second detection block comprises:
a second transistor, and wherein to ensure that the responding speed of the second detection block with respect to the rise in the output voltage is faster than the responding speed of the first detection block, at least one of a gate threshold voltage, a channel width, a channel length and a doping amount of the second transistor is controlled.

6. The voltage generation circuit according to claim 1, wherein the first detection block compares a first reference voltage and the output voltage and outputs the first detection signal according to a first comparison result, and
wherein the second detection block compares a second reference voltage and the output voltage and outputs the second detection signal according to a second comparison result.

7. The voltage generation circuit according to claim 6, wherein a level of the first reference voltage is higher than a level of the second reference voltage.

8. The voltage generation circuit according to claim 1, wherein the signal generation block generates the control signal in response to one signal which transitions more quickly, between the first detection signal and the second detection signal having the same logic level.

9. The voltage generation circuit according to claim 1, wherein the first detection block comprises:
a first voltage division block configured to divide the output voltage and output a divided output voltage, and
wherein the first detection block compares the first reference voltage and the divided output voltage and outputs the first detection signal according to a first comparison result.

10. The voltage generation circuit according to claim 1, wherein the second detection block comprises:
a second voltage division block configured to divide the output voltage and output a divided output voltage, and
wherein the second detection block compares the second reference voltage and the divided output voltage and outputs the second detection signal according to a second comparison result.

11. A voltage generation circuit of a semiconductor apparatus, comprising:
a first detection block configured to detect an output voltage and output a first detection signal according to a first detection result;
a second detection block configured to detect the output voltage and output a second detection signal according to a second detection result; and
a voltage generation block configured to an on or off position based on the first detection signal and the second detection signal, and to generate the output voltage when being in the on position,
wherein when there is a voltage change, both the first detection signal and the second detection signal will be enabled or both will be disabled, but the first detection signal is disabled earlier than the second detection signal when the output voltage falls, and the second detection signal is enabled earlier than the first detection signal when the output voltage rises, and
wherein the voltage generation block is turned on in response to the first detection signal, and turned off in response to the second detection signal.

12. The voltage generation circuit according to claim 11, wherein the voltage generation block is turned on based on the first detection signal which is disabled, and turned off based on the second detection signal which is enabled.

13. The voltage generation circuit according to claim 11, wherein the first detection block compares a first reference voltage and the output voltage and outputs the first detection signal according to a first comparison result, and
wherein the second detection block compares a second reference voltage and the output voltage and outputs the second detection signal according to a second comparison result.

14. The voltage generation circuit according to claim 13, wherein a level of the first reference voltage is higher than a level of the second reference voltage.

15. The voltage generation circuit according to claim 11, wherein the voltage generation block comprises:
a signal generation block configured to generate a control signal which is enabled, in response to the first detection signal which transitions from an enabled state to a disabled state, and generate the control signal which is disabled, in response to the second detection signal which transitions from a disabled state to an enabled state.

16. The voltage generation circuit according to claim 15, wherein the voltage generation block is turned on when the control signal is enabled.

17. The voltage generation circuit according to claim 11, wherein the first detection block comprises:
a first voltage division block configured to divide the output voltage and output a divided output voltage, and
wherein the first detection block compares the first reference voltage and the divided output voltage and outputs the first detection signal according to a first comparison result.

18. The voltage generation circuit according to claim 17, wherein the first reference voltage is set in response to a division ratio of the first voltage division block.

19. The voltage generation circuit according to claim 11, wherein the second detection block comprises:
a second voltage division block configured to divide the output voltage and output a divided output voltage, and
wherein the second detection block compares the second reference voltage and the divided output voltage and outputs the second detection signal according to a second comparison result.

20. The voltage generation circuit according to claim 19, wherein the second reference voltage is set in response to a division ratio of the second voltage division block.

* * * * *